United States Patent
Holmes et al.

(10) Patent No.: US 6,897,457 B1
(45) Date of Patent: May 24, 2005

(54) APPARATUS AND METHOD FOR MONITORING AND TUNING AN ION BEAM IN ION IMPLANTATION APPARATUS

(75) Inventors: Andrew James Timothy Holmes, Oxon (GB); David Richard Burgin, West Sussex (GB); Simon Povall, West Sussex (GB); David George Armour, Salford (GB); Drew Arnold, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/869,795

(22) PCT Filed: Dec. 23, 1999

(86) PCT No.: PCT/GB99/04402

§ 371 (c)(1),
(2), (4) Date: Sep. 24, 2001

(87) PCT Pub. No.: WO00/41205

PCT Pub. Date: Jul. 13, 2000

(30) Foreign Application Priority Data

Jan. 5, 1999 (GB) .............................................. 9900145

(51) Int. Cl.[7] .............................................. H01J 37/15
(52) U.S. Cl. ............................. 250/492.21; 250/423 F; 250/423 P; 250/492.1; 250/492.3; 250/398; 313/363.1
(58) Field of Search ................................ 250/281, 282, 250/423 F, 423 P, 492.1, 492.2, 492.21, 492.3, 797, 798, 396 R, 396 MC; 313/363.1; 324/126, 71.3

(56) References Cited

U.S. PATENT DOCUMENTS

| | | | | |
|---|---|---|---|---|
| 4,757,208 A | * | 7/1988 | McKenna et al. ....... | 250/492.2 |
| 4,939,371 A | * | 7/1990 | Goto .......................... | 250/397 |
| 5,035,787 A | * | 7/1991 | Parker et al. .......... | 204/192.34 |
| 5,061,851 A | | 10/1991 | Noguchi | |
| 5,301,124 A | | 4/1994 | Chan et al. | |
| 5,475,231 A | * | 12/1995 | Crook et al. ................. | 250/397 |
| 5,883,391 A | * | 3/1999 | Adibi et al. ............ | 250/492.21 |
| 6,060,715 A | * | 5/2000 | England et al. ........ | 250/492.21 |
| 6,559,454 B1 | * | 5/2003 | Murrell et al. .......... | 250/423 R |

FOREIGN PATENT DOCUMENTS

| | | |
|---|---|---|
| GB | 830307 | 3/1960 |
| GB | 1249346 | 10/1971 |
| JP | 7-153401 A | 6/1995 |

OTHER PUBLICATIONS

Patent Abstracts of Japan, vol. 15, No. 258, & JP 3–84843 A.
Patent Abstracts of Japan, vol. 12, No. 94 & JP 62–226551 A.

* cited by examiner

*Primary Examiner*—John R. Lee
*Assistant Examiner*—David A. Vanore
(74) *Attorney, Agent, or Firm*—Boult Wade Tennant

(57) ABSTRACT

An ion implanter has an ion source (10) and an ion beam extraction assembly (50) for extracting the ions. The extraction assembly (50) is a tetrode structure and one of the pairs of extraction electrodes (51) has left and right ports (54, 55) located in opposite sides of the ion beam emerging from the ion source (10). The left and right electrode ports (54, 55) are electrically isolated from each other and connected to independent voltage sources (210, 230). The ion implanter also has a baffle plate (60) at the entrance to a mass analyser (90) downstream of the extraction assembly (50). The baffle plate (60) is also split into two halves (60' and 60"). By measuring the beam current incident on the two halves (60', 60") of the baffle (60), the relative voltages supplied to the left and right electrode parts (54, 55) may be adjusted so as to steer the ion beam and adjust the angle of incidence of the longitudinal axis thereof relative to the input of the analysing magnet (90).

13 Claims, 3 Drawing Sheets

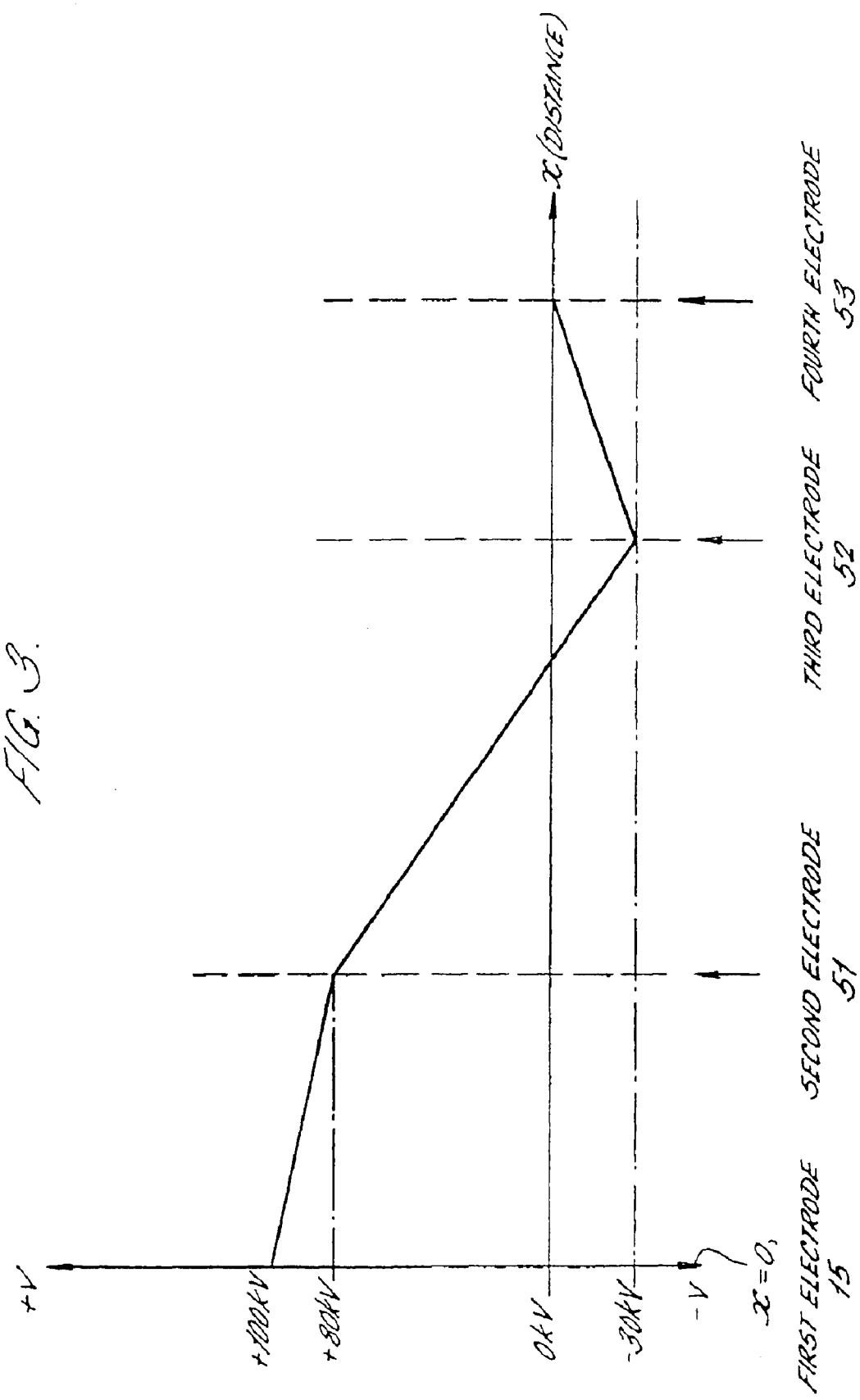

APPARATUS AND METHOD FOR MONITORING AND TUNING AN ION BEAM IN ION IMPLANTATION APPARATUS

This application claims priority under 35 U.S.C. § 119 of United Kingdom Application No. 9900145.5, which has a filing date of Jan. 5, 1999, in accordance with 37 C.F.R. § 1.55(1)(ii) and which was identified in accordance with the regulations under the Patent Cooperation Treaty as a priority document to PCT International Application No. PCT/GB99/04402 from which this application is derived.

FIELD OF THE INVENTION

The present invention relates to ion beam monitoring and tuning in, for example, an ion implantation apparatus for implanting ions from an ion beam into target substrates such as semiconductor wafers.

BACKGROUND OF THE INVENTION

In the manufacture of semiconductor devices and integrated circuits it is known to modify the semiconductor substrate material by diffusing or implanting atoms or molecules of selected dopants into the substrate. The substrate materials are usually silicon or germanium.

This process produces regions of selected varying conductivity in the semiconductor substrate, with majority charge carriers of different polarities. Typical dopant materials used are boron, phosphorus, arsenic and antimony.

Doping the semiconductor substrate using ion implantation has become increasingly important with the continuing reduction in feature sizes on integrated circuit structures.

Ion implanters generally comprise a source of ions of the element to be implanted in the semiconductor substrate, and an extraction assembly for extracting the ions from the source and forming a beam of extracted ions.

The ions in the ion beam are directed towards a mass analyser and selector for selecting a particular species of ion in the ion beam. Selection is carried out using a magnetic field which is transverse to the initial direction of motion of the ions entering the mass analyser. The ion beam is deflected along a curved trajectory by the magnetic field with the radius of curvature determined by the mass/charge ratio of each ion. The exit of the mass analyser contains a slit so that only ions of a chosen mass/charge ratio are allowed to pass out of it. Any ions not having the desired mass/charge ratio impinge upon points adjacent the slit and do not exit the mass analyser, which acts as a Faraday cage.

Following mass selection, the selected ions pass along a generally linear path towards the substrate. Under certain circumstances, it may be desirable to alter the energy of the ions post mass selection, to adjust the depth to which the ions are implanted. Furthermore, co ensure homogeneous doping, it is common to scan the substrate relative to the ion beam. In one process treatment, therefore, the dose at any position on the substrate is made up of components from a large number of individual scans. Although the ion beam may be scanned relative to a fixed substrate, it is at present more usual to scan the substrate holder mechanically relative to a fixed or moving direction ion beam.

The ion beam extracted from the ion source tends to expand radially as it travels towards the mass analyser, as a consequence of, for example, space charge, Brownian (thermal) motion and the partial defocusing effect of the ion source extraction electrodes. In addition, the ion beam axis is often not initially parallel to that specified in the magnet design. The beam is required to enter the magnet at a specific angle to the pole faces if correct focussing is to be obtained. Again, the usual cause of this is mechanical misalignment between the ion source and the mass analyser, predominantly caused by deflection from the source magnetic field.

Because each of the ions of a given mass/charge ratio are moving in a fixed, transverse magnetic field, they are focussed upon the exit slit, regardless of their angle of incidence into the analyser. However, only chose ions entering the mass analyser at the specified angle will leave the exist slit with the correct trajectories. If the ion beam axis is misaligned with the entrance aperture of the mass analyser, then although each of the ions will focus upon the exit slit, they will be incident at an incorrect angle. Similarly, even if the ion beam axis (in the direction of the beam) is at the specified angle to the pole face, there will still be some ions in the (expanding) beam travelling non-parallel to that beam axis. Thus, any misalignment and/or divergence in the ion beam extracted from the ion source will translate into a respective misalignment and/or divergence in the ion beam post mass selection.

Such aspects of the ion beam are undesirable. The ion implanter usually contains a number of electrodes downstream of the mass analyser, for example to accelerate or decelerate the ions prior to implantation. These electrodes are typically coaxial with the axis of the ion beam, and thus divergence in or misalignment of the beam causes the ions to strike the electrodes. This causes sputtering of the electrodes, which introduces unwanted ions into the implanter, and also causes a part of the ion beam to be wasted. Thus, attempts have been made to address both beam divergence (defocusing) and beam direction.

The width and direction of the ion beam could be adjusted post mass selection. The problems with this are the added complexity of additional moving parts, implanter contamination and an increase in beam path length.

As an alternative, the ion beam direction may be adjusted prior to mass selection. To minimise the solid angle of the ion beam as it enters the mass analyser (and hence minimise the beam's solid angle upon exit therefrom), the entrance aperture of the mass analyser is fitted with a baffle. This baffle has a hole in it with a diameter which allows a central part of the ion beam to be passed whilst absorbing the radial periphery of the beam.

To adjust the angle of incidence of the ion beam from the ion source, relative to the entrance aperture of the mass analyser, (a process often called "tuning" of the ion beam), the electrodes in the ion source have traditionally been mechanically adjustable. By moving the electrodes in both a plane parallel to, and a plane perpendicular to, the entrance aperture of the mass analyser, the angle of the ion beam axis may be adjusted. This tuning process is carried out prior to commencement of implantation of a substrate and largely involves trial and error; an operator moves the ion source (extraction) electrodes are moved until the size and shape of the ion beam at the substrate holder is optimised. Scanning and focussing of the beam is a time consuming operation.

Commonly assigned U.S. patent application Ser. No. 08/962,257, entitled "METHOD AND APPARATUS FOR ION BEAM SCANNING IN AN ION IMPLANTER", to England and Holmes, the content of which is incorporated herein by reference in its entirety, describes a tetrode ion extraction assembly for scanning the ion beam at the ion source. One of the four electrodes is split, and to each half of this electrode is applied an AC voltage which is independently adjustable. This technique permits electrostatic steering of the ion beam and thus obviates the need for mechanical adjustment of the electrodes co align the ion beam. However, in the technique disclosed in U.S. Ser. No. 08/962,257, a sawtooth voltage is applied to the split electrode such that the ion beam axis scans repeatedly about a mean angle, in turn to scan the post mass selection ion beam across the substrate.

SUMMARY OF THE INVENTION

The present invention addresses these and other problems with the prior art. According to a first aspect of the present invention, there is provided an ion implanter for implanting ions into a target substrate, comprising an ion source, an ion beam extraction assembly for extracting ions from the ion source and forming a beam of extracted ions, the extraction assembly including deflection means for controllably altering the deflection of said beam of extracted ions, a substrate holder downstream of the ion beam extraction assembly, for holding the said target substrate, and a deflection monitor, arranged between the extraction assembly and the substrate holder, for monitoring the deflection of said ion beam, said monitor comprising first and second electrically conductive surfaces, said first and second surfaces being adjacent and electrically isolated from one another, and defining an aperture therebetween to permit passage of at least a part of said ion beam in use, and current measurement means, for measuring the difference between a current generated upon said first surface by a part of said ion beam and the current generated upon said second surface by another part of said ion beam, said current difference being indicative of the degree of deflection of said ion beam.

The difference in the currents generated upon the first and second surfaces represents the angle of the ion beam exiting the ion beam extraction assembly relative to the beam line axis, (the latter being defined as the shortest path between the ion source and the substrate holder). The extraction assembly may then be adjusted until the monitor indicates substantially a zero difference between the current on the two surfaces. At this point, the longitudinal axis of the ion beam will be parallel with the beam line axis. The element of trial and error is thereby eliminated.

Preferably, the deflection means comprises a steering electrode having first and second electrically isolated electrode members defining therebetween a steering electrode aperture through which the ion beam may pass, the deflection means further comprising a voltage generator for applying a first voltage to the first electrode member and a second voltage to the second electrode member, the ion beam being controllably deflected in dependence upon the difference between the first and second voltages.

It is quicker to adjust the angle of deflection of the ion beam electrostatically than mechanically. There is less scope for accidentally misaligning the ion source relative to the beam line if it is not necessary to touch the extraction electrodes during set up. Furthermore, electrostatic deflection allows the ion beam angle to be adjusted during doping, which clearly could not be done with mechanical adjustment.

The implanter may further comprise a controller arranged to receive a signal representative of the current difference measured by the current measurement means, the controller controlling the difference between the first and second voltages to adjust the deflection of the ion beam in dependence upon the received signal.

Thus, a feedback loop may be arranged, with the monitor providing information on the beam angle to the controller. This in turn may send a demand signal, for example, to each of the first and second members of the steering electrode to adjust the deflection of the ion beam and bring it automatically into alignment with the beam line axis.

The ion source may comprise an arc chamber in which ions are formed, the arc chamber having a front face including an exit aperture through which ions can be extracted from the arc chamber, the front face defining a first electrode, the steering electrode being adjacent the first electrode. Furthermore, a third apertured electrode may be provided adjacent the steering electrode and a fourth apertured electrode adjacent the third electrode, the first, steering, third and fourth electrodes being electrically insulated from one another.

Preferably, the voltage generator is arranged to generate first and second voltages each of which includes a DC component to produce a static electric field between the first and second electrode members, wherein the ion beam is deflected by a fixed angle.

A DC voltage provided to the first and second members of the steering electrode generates an electrostatic field across the aperture between them, when the voltage difference is non-zero. This electrostatic field is of fixed magnitude and direction, and will therefore deflect or steer the ion beam in a direction related to the magnitude and direction of that electrostatic field.

Preferably, the voltage generator is further arranged to generate first and second voltages each of which also include an AC component, to produce an oscillating transverse electric field as well as the static electric field between the first and second electrode members, wherein the ions within the ion beam are caused to oscillate substantially transversely to a longitudinal axis of the ion beam to increase the current generated upon at least one of the first and second electrically conductive surfaces of the deflecting monitor.

Sometimes, the ion beam is relatively narrow and fails to strike the electrically conductive surfaces of the monitor, even when the ion beam is at an angle to the beam line axis. To artificially spread the ion beam in a direction perpendicular to its longitudinal axis, an AC voltage is applied on top of the DC steering voltage. The AC voltage causes the ions oscillate in a direction transverse to the aperture in the steering electrode, thus forcing them onto the monitor surfaces such that an ion current may be detected.

The implanter may include an ion mass selector between the ion beam extraction assembly and the substrate holder, for selecting ions of a desired mass in the ion beam to be implanted into the target substrate.

The first and second electrically conductive surfaces may constitute respective halves of a baffle downstream of the ion beam extraction assembly. If an ion mass selector is present, the baffle may be mounted adjacent an entrance to it.

According to a second as aspect of the present invention, there is provided a deflection monitor for monitoring the deflection of an ion beam exiting an ion beam extraction assembly, the monitor comprising first and second electrically conductive surfaces, the first and second surfaces being adjacent and electrically isolated from one another, and defining an aperture therebetween to permit passage of at least a part of the ion beam, and current measurement means, for measuring the difference between a current generated upon the first surface by a part of the ion beam, and the current generated upon the second surface by another part of the ion beam, the current difference being indicative of the degree of deflection of the ion beam.

In a third aspect of the present invention, there is provided an apparatus for extracting ions from an arc chamber and forming a steerable beam of the extracted ions, comprising an electrode assembly including a steering electrode having first and second electrically separate electrode members defining therebetween an aperture through which the ions may pass, and voltage generation means for providing a first DC voltage to the first electrode member and for providing a second DC voltage to the second electrode member, a difference between the first and second DC voltages generating a static electric field across the aperture, whereby the ion beam may be steered by an amount related to the said voltage difference.

The invention also extends to a method of monitoring the deflection of an ion beam exiting an ion beam extraction assembly in an ion beam implanter, the method comprising the steps of directing the ion beam through an aperture between first and second electrically conductive surfaces, the first and second electrically conductive surfaces being electrically isolated from one another, and measuring the difference between a current generated upon the first surface by a part of the ion beam, and the current generated upon the second surface by another part of the ion beam, whereby the current difference is indicative of the degree of deflection of the ion beam.

In yet a further aspect of the present invention, there is provided a method of steering an ion beam exiting an ion beam extraction assembly in an ion implanter, the method comprising the steps of electrostatically deflecting the ions in the extraction assembly transversely of the beam direction at a deflection position where the ions experience an accelerating or decelerating field in the beam direction, thereby angularly steering the direction of the beam, directing the ion beam through an aperture between first and second electrically conductive surfaces each arranged downstream of the deflection position, the first and second surfaces being electrically isolated from one another, measuring the difference between a current generated upon the first surface as it is struck by a part of the ion beam, and the current generated upon the second surface as it is struck by another part of the ion beam, whereby the current difference is indicative of the degree of deflection of the ion beam, and selectively adjusting the amount of electrostatic deflection of the ions until the difference between the current generated upon the first surface and the current generated upon the second surface, becomes substantially zero.

In yet another aspect of the present invention, there is provided a method of steering an ion beam exiting an ion beam extraction assembly in an ion implanter, the ion beam extraction assembly including a steering electrode comprising first and second electrically isolated electrode members defining therebetween an aperture through which ions in the ion beam may pass, the method comprising the steps of applying a first DC voltage to the first electrode member, and applying a second DC voltage to the second electrode member, whereby a difference between the first and second DC voltages causes a static electric field to be generated transversely of the aperture between the first and second electrode members, such that the ions are electrostatically deflected through an angle related to the DC voltage difference.

Further advantageous features of the invention are set out in the dependent claims. It will be understood that those preferred features of the first aspect of the invention recited above are equally applicable to the other aspects of the invention, mutatis mutandis.

BRIEF DESCRIPTION OF THE DRAWINGS

Embodiments of the present invention will now be described, by way of example only, and with reference to the accompanying Figures in which:

FIG. 3 is a schematic drawing showing typical potentials for the electrodes in the ion source of FIG. 2, and how these vary with distance.

DETAILED DESCRIPTION

Figure 1:
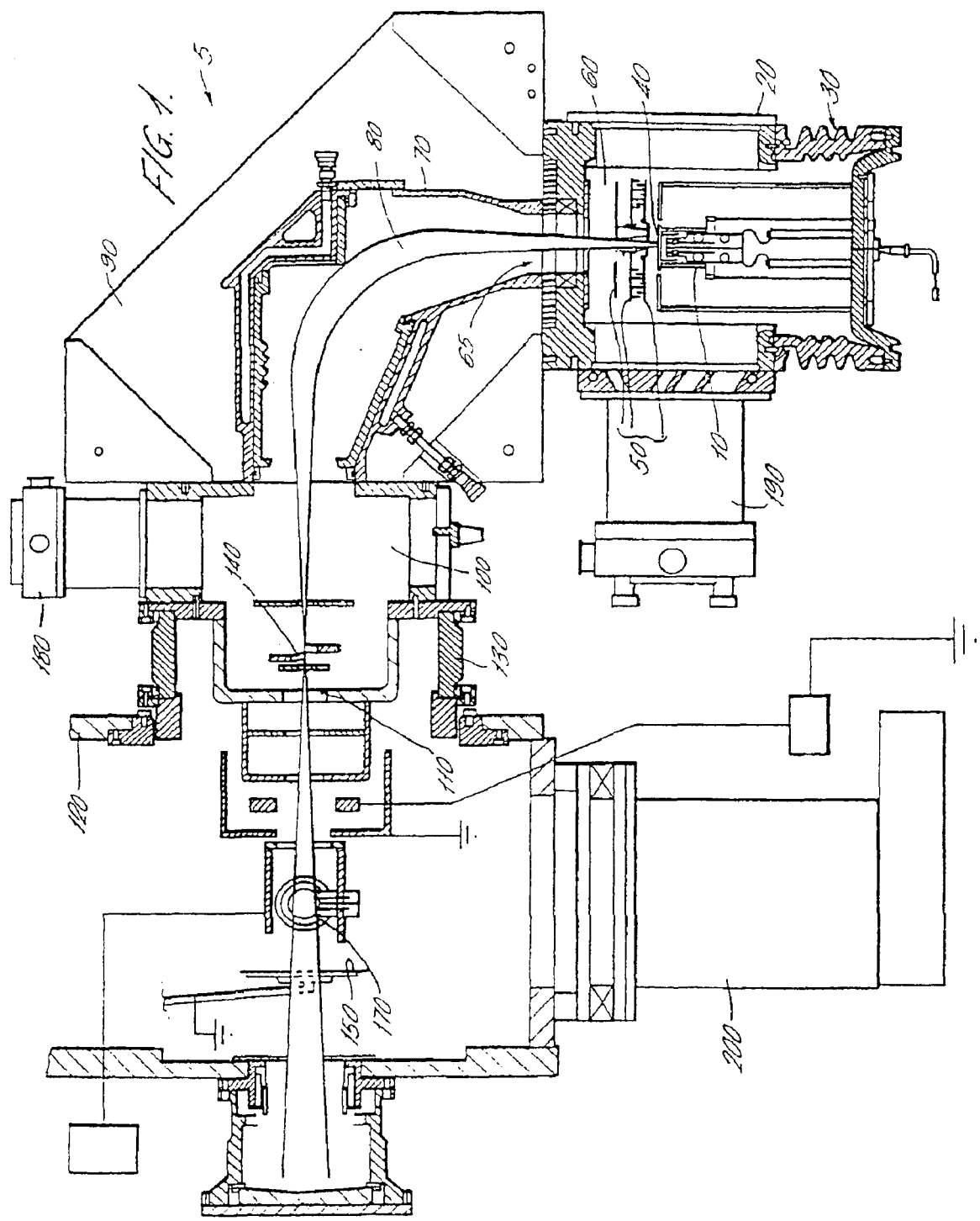
FIG. 1 shows a schematic view of an ion implanter embodying the present invention.

Referring to FIG. 1, a schematic sectional view of an ion implanter 5 is shown. The implanter includes an ion source 10, such as a Freeman or Bernas source. The ion source 10 is fed with a supply of atoms of, or molecules containing, the element, ions of which are to be implanted in a target substrate 150. The molecules may be supplied to the ion source 10 in gaseous or vapour form. As will be well known to those skilled in the art, the ion source strips electrons from the atoms or molecules to generate a plasma.

The ion source 10 is mounted within an evacuated ion source housing 20, but is spaced and insulated therefrom by first insulating bushing 30.

Ions from the plasma exit the ion source 10 through an ion source slit 40 in the front face thereof. Located immediately adjacent the ion source slit 40 is a set of extraction electrodes 50 which will be described in more detail with reference to FIG. 2 below. In general, however, the extraction electrodes 50 are adjusted to generate an ion beam 80 having an optimum extraction energy.

The ion source housing 20 is attached to an analysing magnet 90. The analysing magnet 90 has an entrance aperture, shown generally at 65, and ions extracted from the ion source 10 pass from the ion source housing 20 into a flight tube 70 of the analysing magnet 90 through the entrance aperture 65. As will be described in more detail in connection with FIG. 2, the extraction electrodes 50 are further arranged to permit adjustment of the angle of the axis of the ion beam 80 (shown in FIG. 1 with a dashed line) relative to the entrance aperture 65.

Mounted between the entrance aperture 65 of the analysing magnet 90 and the extraction electrodes 50 is a baffle 60. This has a hole coaxial with, but typically having a smaller diameter than the entrance aperture 65. The baffle thus restricts the angular spread of ions in the ion beam 80. In particular, whilst the central parts of the ion beam 80 are able to pass through the hole in the baffle 60, the radially peripheral parts of the beam impinge upon the baffle itself and are prevented from entering the analysing magnet 90.

In the analysing magnet 90, the ions in the ion beam 80 travel through a region of uniform, strong magnetic field. This causes the ions to adopt flight paths having radii of curvature dependent upon the mass/charge ratio of the individual ions.

Ions of a predetermined range of mass/charge ratios travel through the analysing magnet 90 in curves and emerge generally at right angles to the original beam path. At the end of the region of constant magnetic field, the ions enter a mass selection region 100 which contains one or more slits 140 that define precisely the mass/charge ratio selected by an operator of the apparatus for implanting into the substrate 150.

The ion implanter illustrated permits a range of ion extraction energies from the ion source 10. The extraction electrodes 50 typically accelerate the ions, after extraction from the ion source 10, to energies of about 10 keV or higher. The ions are retained at this energy throughout their passage through the analysing magnet 90 and the mass selection region 100. Thus, the flight tube 70 of the analysing magnet 90 is maintained at a common potential with both the ion source housing 20 and a housing 110 of the mass selection region 100. As explained above, the ion source 10 is biased at up to 100 kV relative to this flight tube (which is normally defined to be at ground potential), to generate the required extraction bias.

Depending upon the type of ions selected for implantation, and the depth to which it is desired to implant these ions into the substrate 150, the ions exiting the slits in the mass selection region 100 may be accelerated, decelerated or allowed to remain at the same energy with which they travel through the analysing magnet 90. To permit acceleration, for example, up to 200 keV (from a maximum energy at which they pass through the analysing magnet, which varies depending upon ion species and other factors), a negative potential is applied between the substrate 150 and the flight tube/mass selection region housing. For this purpose, a wafer housing 120, containing the semiconductor wafer 150 to be implanted, is insulated from the mass selection region housing 110 by means of second insulating bushing 130. The wafer 150 to be implanted is mounted upon a holder in the wafer housing 120, and the whole target region, including the wafer housing 120 and the wafer holder is held at ground potential. The mass selection housing 110 is then biased as required relative to the wafer housing 120 to provide the required acceleration potential to accelerate mass selected ions to the required implantation energy. Of course, to decelerate the ions post mass selection, the mass selection region housing 110 is biased relative to the wafer housing 120 at a positive potential.

Immediately prior to incidence upon the substrate to be implanted 150, a plasma gun 170 floods the beam and the substrate with low energy electrons to neutralise any charge accumulation on the surface of the substrate due to implanted ions.

To prevent scattering of the ion beam, the entire region between the ion source and the substrate is evacuated, for example using turbo pumps 180, 190, 200. These evacuate the mass selection region, ion source and target region respectively.

The ion beam 80 shown in FIG. 1 is shown with its axis optimally aligned with the implanted axis, and with the amount of ion beam divergence at the extraction electrodes minimised. It will be seen that the ion beam expands from a focal point between the ion source 10 and extraction electrodes 50 and into the analysing magnet 90. The transverse magnetic field, however, focuses the ion beam 80 back to a point coincident with the slits in the mass selection region 100. The ion beam then diverges again as it travels on to the substrate 150. As explained above, problems with sputtering off downstream electrodes can occur if the ion beam is not optimally aligned and focused.

Figure 2:
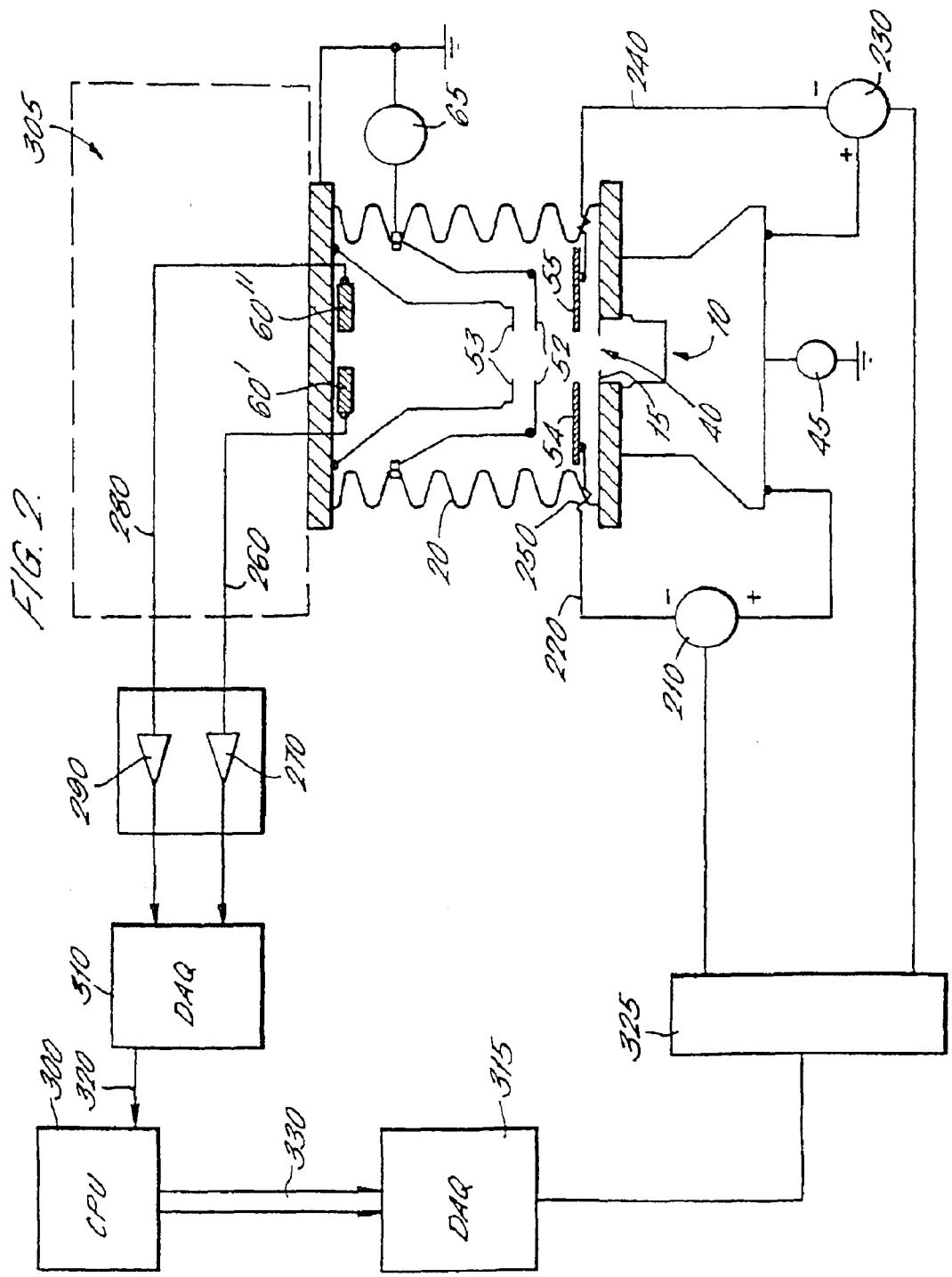
FIG. 2 shows, in more detail, the ion source and the entrance to the mass analyser in the implanter of FIG. 1.

The manner in which the ion beam axis is monitored and adjusted will now be described, with particular reference to FIG. 2. FIG. 2 shows a close up sectional view of the ion source and housing of FIG. 1 in schematic form, together with a schematic diagram of the electronic circuitry connected to the extraction electrodes. Features common to FIGS. 1 and 2 are indicated by like reference numerals.

Ions formed in the ion source 10 are extracted therefrom through the ion source slit 40 in a front face 15 of the ion source 10. The front face 15 forms a first apertured electrode at the potential of the ion source 10. The extraction electrodes 50 (FIG. 1) are illustrated in more detail in FIG. 2 by second, third and fourth apertured electrodes 51, 52 and 53 respectively. The two apertured electrodes 52 and 53 each comprise a single electrically conductive plate having an aperture therethrough to allow the ion beam emerging from the ion source 10 to pass through. Electrode 51, however, comprises electrically separate, i.e. not electrically connected, left and right parts 54 and 55 located on opposite sides of the ion beam emerging from the ion source. For a beam of positive ions, the ion source 10 is maintained by a first voltage supply 45 at a positive voltage relative to ground. Typically, the first voltage supply 45 may comprise a 100 kV stack in series with an 8 kilowatt converter.

The left and right second extraction electrodes 54, 55 are attached to ground via separate −20 kV, 400 watt second and third voltage supplies 210, 230 respectively. Each are in parallel with load and protect circuits (not shown).

The third extraction electrode 52 operates as a suppression electrode and is biased, for example, by a −30 kV, 400 Watt fourth voltage supply 65, relative to ground. Again, a protection assembly (not shown) is preferably employed.

The negatively biased third electrode 52 operates to prevent electrons in the ion beam downstream of the fourth electrode 53 from being drawn into the extraction region and into the ion source 10. As will be familiar to those skilled in the art, it is important to minimize the loss of electrons from the ion beam in zero electric field regions, so as to maintain ion beam neutralization.

Thus, the electric fields (generated between the fourth electrode 53 at ground and the ion source 10) are restricted from penetrating into the region downstream of the fourth electrode 53 (that is, the region vertically above the fourth electrode 53 as viewed in FIG. 2).

FIG. 3 shows, schematically, how the potential varies with distance away from the first extraction electrode 15, with voltage supplies 45, 210, 230 and 65 as exemplified above.

Referring once more to FIG. 2, the second electrode 51 forms a deflection lens and the electrically separate left and right parts 54, 55 can be held at different voltages by the independently adjustable second and third voltage supplies 210, 230 respectively. This generates a transverse electric field component across the ion beam which can deflect the ion beam emerging from the ion source 10.

The embodiment shown in FIG. 2 has separate voltage supplies 210, 230. Of course, as an alternative a single voltage supply with a potential divider could be used.

The left hand electrode 54 is connected to the second voltage supply 210 by line 220, and the right hand electrode 55 is connected along line 240 to the third voltage supply 230. Because the ion source housing 20 is evacuated, the lines 220, 240 pass through vacuum-tight seals 250 within the first insulating bushing (not shown in FIG. 2). It will be appreciated that, in fact, the third and fourth electrodes 52, 53 will be connected respectively to the fourth voltage supply 65 and to ground, as explained above, by leads which may also pass through these (or other) vacuum-tight seals.

By adjusting the relative potentials of the left and right electrodes 54, 55 in the second electrode 51, the ion beam may be "steered". That is, the angle of incidence of the longitudinal axis of the ion beam to the input of the analysing magnet 90 (FIG. 1) may be adjusted.

As previously explained, it is usually desirable to "tune" the ion beam so that its axis is aligned with the beam line axis. To achieve such alignment, the alpha baffle 60 is employed. Unlike the arrangement in previous implanters, here the alpha baffle 60 is split into two parts, with the left part of the baffle 60' being electrically separate (i.e. not electrically connected) to the right part of the alpha baffle 60". For example, the baffle 60 may be generally annular with each part describing a semi-annulus.

The left part of the baffle is electrically connected by a third line 260 to a first current-to-voltage converter 270. The current-to-voltage converter may, for example, comprise an operational amplifier with a virtual earth to provide an output having a potential difference proportional to its input current. Such devices will be familiar to those skilled in the art and will not be explained further.

Separately, the right part of the alpha baffle 60" is electrically connected by a fourth line 280 to a second current-to-voltage converter 290. In preference, each of the third and fourth lines 260, 280 pass through the vacuum tight seals 250 along with the electrically connections to the extraction electrodes 50. Of course, each of the four lines 220, 240, 260, 280 are insulated from one another.

As the ion beam emerges from the fourth extraction electrode 53, it is partially defocused for reasons set out above. The purpose of the alpha baffle 60 is to remove the radially extending parts of the defocused ion beam, and just allow the central part of the ion beam to pass through the central aperture of the baffle 60. However, the incidence of ions towards the radial edges of the ion beam upon the alpha baffle 60 may be used advantageously to tune or align the ion beam.

Ions incident upon each part of the baffle 60', 60" will generate a current proportional to the number of ions striking each part of the baffle over a given amount of time. Therefore, if the current flowing from the left part of the baffle 60' is measured and compared with the current flowing from the right part of the baffle 60', then, assuming that the ion beam is generally symmetrical about its axis, the angle of incidence of the ion beam axis to the alpha baffle may be determined. Moreover, by adjusting the voltages on the left and right electrodes 54, 55 of the second electrode 51, the beam axis may be adjusted (i.e., rotated clockwise or counter-clockwise as viewed in FIG. 2) until the current generated on the left part of the baffle 60' is the same as the current generated from the right part of the baffle 60". At this point, the axis of the ion beam is perpendicular to the aperture in the baffle 60.

Although such tuning may be done manually, it is more efficient and accurate to employ a feedback loop controlled by a CPU 300. The voltage output of the first current-to-voltage converter 270, which represents the number of ions incident on the left part of the baffle 60' is measured by a first data acquisitor 310. Similarly, the data acquisitor 310 receives a voltage input from the second current-to-voltage converter 290, this voltage being representative of the beam current incident upon the right part of the baffle 60". Typically, the data acquisitor 310 converts the voltage inputs from first and second lines 260, 280 from an analogue to a digital signal and stores a continually updated value of each voltage. The CPU 300 polls the data acquisitor 310 via line 320 on a regular basis. A differential demand signal is sent from the CPU to a second data acquisitor 315 in response to the difference between the currents on the left and right parts 60', 60" of the alpha baffle 60 respectively. This demand signal is in turn fed via a voltage supply interface 325 to the second and third voltage supplies 210, 230, whose outputs are therefore adjusted in dependence upon the demand signal to adjust the relative voltages upon the left and right electrodes 54, 55 of the second electrode 51.

The first and second data acquisitors 310, 315 may include proportional-integral-differential (P-I-D) circuitry to suppress positive feedback within the control loop when the difference between the ion current on the left part 60' and the right part 60" of the baffle 60 approaches zero.

Thus, it will be seen that the ion beam may be tuned automatically, without intervention by an operator. Typically, the process would be carried out prior to the commencement of doping of a substrate. By employing this arrangement, it is possible to ensure that the ion beam is launched into the mass analyser 90 such that the optimum path is taken through the poles, thus maintaining the shape and quality of the ion beam over time.

The apertures in the first, second, third and fourth electrodes preferably increase in diameter, in a direction from the first to the fourth electrode. This is because the ion beam expands in the direction of motion. The degree of defocusing of the ion beam after extraction from the ion source 10 is, to a certain extent, dependent upon the extraction energy and type of ion to be implanted. In certain circumstances, the ion beam is narrow and not significantly defocused. Thus, when the axis of such a beam is correctly aligned perpendicular to the entrance aperture in the alpha baffle 60, the beam width is less than the width of this aperture, and any current generated on etcher of the left and right baffle parts 60', 60" is below the noise threshold. More importantly, however, the width of some ion beams is such that, even if the ion beam is not correctly tuned, it still does not impinge upon either part of the alpha baffle 60 and no monitoring to aid adjustment can then be carried out.

To address this, the second and third voltage supplies 210, 230 are each capable of generating both DC and AC signals. The DC voltages applied to the left and right electrodes 54, 55 generate the electric field across the aperture in the second electrode 51, to steer the beam. However, by modulating the DC voltage on the electrodes 54, 55 with a small alternating voltage, the ions in the ion beam are caused to oscillate in a direction transverse to the ion beam axis. Thus, a previously narrow beam may be "spread" by the AC signal to force it onto the two parts of the baffle 60 as it passes through the aperture in it.

A variety of alternating signals can be applied to the quiescent DC voltage bias. For example, equal magnitude sinusoidal voltages may be applied to the left and right electrodes 54, 55 respectively, but with the alternating voltage applied to the left electrode 54 being in antiphase with the alternating voltage upon the right electrode 55.

The effect of applying AC modulation to the DC voltages used to steer the beam is to generate an alternating current upon each of the left and right parts of the baffle 60. If the axis of the beam is concentric with the central axis of the alpha baffle aperture, then the AC signal measured upon the left part of the baffle 60' will have an equal magnitude to the alternating current signal measured from the right hand part of the baffle 60". If the alternating current signals of each part of the baffle 60 differ, however, then the DC voltages applied to the left and right electrodes 54, 55 of the second electrode 51 are adjusted. This adjusts the steering of the beam. The adjustment can be carried out with a feedback loop under software control by the CPU, as before. Once the quiescent DC voltage on each of the left and right electrodes 54, 55 has been adjusted such that the AC signal upon the left and right parts of the baffle 60 is the same, the AC modulation of the DC voltage may be switched off.

Although the arrangement shown in particular in FIG. 2 is normally employed only during set-up of the ion beam prior to implantation, it will be understood that it need not only be used then. It is also useful to be able to monitor the beam tuning during implantation of a substrate. Large semiconductor substrates are relatively expensive and take some time to dope correctly. Although unusual, it is possible for the axis of the ion beam as it enters the mass analyser 90 to move slightly during doping which may affect the quality of the doped wafer. For example, the ion source, which is electrically isolated from the ion source housing by the first insulating bushing 30, may be subject to slight mechanical movement. Because the technique for monitoring the ion beam tuning described above does not affect the continuity of the ion beam, it may be used during doping as well as during set-up.

It will be understood that many variations of the details given above are possible within the scope of the present invention. For example, although in the foregoing, a signal has been taken from a split alpha baffle to monitor and adjust ion beam tuning, it will be understood that a signal could in fact be taken off any suitable electrically conductive part of the apparatus downstream of the extraction electrodes and before the beam magnetic field within the analysing magnet 90. Indeed, it is also possible to take a signal off one of the slits in the mass selection region, because the angle between the ion beam axis and an axis perpendicular to the slits will be similar to the angle between the beam axis and the apertures in the extraction electrodes. The described techniques are also applicable to ion implanters which do not employ mass selection, that is where the substrate is generally in a straight line downstream of the ion source. Therefore, the scope of the invention is to be determined by the following claims, interpreted accordingly.

What is claimed is:

1. An ion implanter for implanting ions into a target substrate, comprising:
   an ion source;
   an ion beam extraction assembly for extracting ions from the ion source and forming a beam of extracted ions, the ion beam extraction assembly including therein a steering electrode having first and second electrically isolated electrode members defining therebetween a steering electrode aperture through which said ion beam may pass, and a voltage generator for applying a first voltage to said first electrode member and a second voltage to said second electrode member, the ion beam being controllably deflected in dependence upon the difference between said first and second voltages;
   said ion source comprising an arc chamber in which ions are formed, said arc chamber having a front face including an exit aperture through which ions can be extracted from the said arc chamber, said front face defining a first electrode, said steering electrode being adjacent the first electrode;
   a substrate holder downstream of the ion beam extraction assembly, for holding the target substrate; and
   a deflection monitor, arranged between the extraction assembly and the substrate holder, for monitoring the deflection of said ion beam, said monitor comprising:
   first and second electrically conductive surfaces, said first and second surface being adjacent and electrically isolated from one another, and defining an aperture therebetween to permit passage of at least a part of said ion beam in use; and
   a current monitor for measuring the difference between a current generated upon said first surface by a part of said ion beam and the current generated upon said second surface by another part of said ion beam, said current difference being indicative of the degree of deflection of said ion beam.

2. An implanter as claimed in claim 1, further comprising a controller arranged to receive a signal representative of the current difference measured by said current measurement means, the controller controlling the difference between said first and second voltages to adjust the deflection of said ion beam in dependence upon said received signal.

3. An implanter as claimed in claim 1, further comprising a third apertured electrode adjacent said steering electrode and a fourth apertured electrode adjacent said third electrode, said first, steering, third and fourth electrodes being electrically insulated from one another.

4. An ion implanter as claimed in any of claim 1, in which the voltage generator is arranged to generate first and second voltages each of which includes a DC component to produce a static electric field between the said first and second electrode members, wherein the ion beam is deflected by a fixed angle.

5. An implanter as claimed in claim 4, in which the voltage generator is further arranged to generate first and second voltages each of which also include an AC component, to produce an oscillating transverse electric field as well as the said static electric field between the said first and second electrode members, wherein the ions within said ion beam are caused to oscillate substantially transversely to a longitudinal axis of the said ion beam to increase the current generated upon at least one of said first and second electrically conductive surfaces of said deflecting monitor.

6. An ion implanter as claimed in claim 1, further comprising an ion mass selector between said ion beam extraction assembly and said substrate holder, for selecting ions of a desired mass in said ion beam to be implanted into said target substrate.

7. An ion implanter as claimed in claim 1, in which the first and second electrically conductive surfaces constitute respective halves of a baffle downstream of the ion beam extraction assembly.

8. An ion implanter as claimed in claim 7, further comprising an ion mass selector between said ion beam extraction assembly and said substrate holder, for selecting ions of a desired mass in said ion beam to be implanted into said target substrate, wherein the ion mass selector defines an entrance and wherein the baffle is mounted adjacent said entrance.

9. An ion implanter comprising:
   an ion source having an arc chamber; an electrode assembly for extracting ions from the arc chamber and forming a steerable beam of the extracted ions, the electrode assembly including therein a steering electrode having first and second electrically separate electrode members defining therebetween an aperture through which the ions may pass;
   and a voltage generator providing a first DC voltage to the first electrode member and providing a second DC voltage to the second electrode member, a difference between the first and second DC voltages generating a static electric field across the aperture,
   whereby the ion beam may be steered by an amount related to the said voltage difference.

10. A method of steering a beam of ions extracted by an extraction assembly from the arc chamber of an ion source in an ion implanter, the method comprising the steps of:
    electrostatically deflecting the ions in the extraction assembly transversely of the beam direction at a deflection position where the ions experience an accelerating or decelerating field in the beam direction, thereby angularly steering the direction of said beam;
    directing said ion beam through an aperture between first and second electrically conductive surfaces each arranged downstream of said deflection position, said first and second surfaces being electrically isolated from one another;

measuring the difference between a current generated upon said first surface as it is struck by a part of said ion beam, and the current generated upon said second surface as it is struck by another part of said ion beam, whereby said current difference is indicative of the degree of deflection of said ion beam; and selectively adjusting the amount of electrostatic deflection of the ions until the difference between the current generated upon said first surface and the current generated upon said second surface, becomes substantially zero.

11. A method of steering an ion beam in an ion beam extraction assembly for the ion source arc chamber of an ion implanter, the ion beam extraction assembly including therein a steering electrode comprising first and second electrically isolated electrode members defining therebetween an aperture through which ions in the said ion beam may pass, the method comprising the steps of:

applying a first DC voltage to the first electrode member; and applying a second DC voltage to the second electrode member;

whereby a difference between said first and second DC voltages causes a static electric field to be generated transversely of said aperture between said first and second electrode members, such that the ions are electrostatically deflected through an angle related to the said DC voltage difference.

12. An ion implanter for implanting ions into a target substrate, comprising:

an ion source;

an ion beam extraction assembly for extracting ions from the ion source and forming a beam of extracted ions, the extraction assembly including a steering electrode having first and second electrically isolated electrode members defining therebetween a steering electrode aperture through which said ion beam may pass, and a voltage generator for applying a first voltage to said first electrode member and a second voltage to said second electrode member, the ion beam being controllably deflected in dependence upon the difference between said first and second voltages;

a substrate holder downstream of the ion beam extraction assembly, for holding the said target substrate; and a deflection monitor, arranged between the extraction assembly and the substrate holder, for monitoring the deflection of said ion beam, said monitor comprising:

first and second electrically conductive surfaces, said first and second surface being adjacent and electrically isolated from one another, and defining an aperture therebetween to permit passage of at least a part of said ion beam in use; and current measurement means, for measuring the difference between a current generated upon said first surface by a part of said ion beam and the current generated upon said second surface by another part of said ion beam, said current difference being indicative of the degree of deflection of said ion beam;

wherein the voltage generator is arranged to generate first and second voltages, each of which includes a DC component to produce a static electrode field between the said first and second electrode members to deflect the ion beam by a fixed angle, and an AC component, to produce an oscillating transverse electric field as well as said static electric field to cause the ions within said ion beam to oscillate substantially transversely to a longitudinal axis of the said ion beam to increase the current generated upon at least one of said first and second electrically conductive surfaces of said deflecting monitor.

13. An ion implanter for implanting ions into a target substrate, comprising:

an ion source;

an ion beam extraction assembly for extracting ions from the ion source and forming a beam of extracted ions, the ion beam extraction assembly including therein a steering electrode having first and second electrically isolated electrode members defining therebetween a steering electrode aperture through which said ion beam may pass, and a voltage generator for applying a first voltage to said first electrode member and a second voltage to said second electrode member, the ion beam being controllably deflected in dependence upon the difference between said first and second voltages; a substrate holder downstream of the ion beam extraction assembly, for holding the target substrate;

an ion beam mass selector between said ion beam extraction assembly and said substrate holder, for selecting ions of a desired mass in said ion beam to be implanted into said target substrate; and a deflection monitor, arranged between the extraction assembly and the substrate holder, for monitoring the deflection of said ion beam, said monitor comprising:

first and second electrically conductive surfaces, said first and second surfaces being adjacent and electrically isolated from one another, and defining an aperture therebetween to permit passage of at least a part of said ion beam in use; and a current monitor for measuring the difference between a current generated upon said first surface by a part of said ion beam and a current generated upon said second surface by another part of said ion beam, said current difference being indicative of the degree of deflection of said ion beam.

* * * * *